(12) United States Patent
Kronholz et al.

(10) Patent No.: US 8,293,596 B2
(45) Date of Patent: Oct. 23, 2012

(54) FORMATION OF A CHANNEL SEMICONDUCTOR ALLOY BY DEPOSITING A HARD MASK FOR THE SELECTIVE EPITAXIAL GROWTH

(75) Inventors: Stephan Kronholz, Dresden (DE); Carsten Reichel, Dresden (DE); Annekathrin Zeun, Dresden (DE); Thorsten Kammler, Ottendorf-Okrilla (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 132 days.

(21) Appl. No.: 12/842,439

(22) Filed: Jul. 23, 2010

(65) Prior Publication Data
US 2011/0027952 A1    Feb. 3, 2011

(30) Foreign Application Priority Data
Jul. 31, 2009    (DE) .................. 10 2009 035 418

(51) Int. Cl.
*H01L 21/8238* (2006.01)
(52) U.S. Cl. .. 438/199; 438/216; 438/275; 257/E21.632
(58) Field of Classification Search .................. 438/197, 438/199, 216, 275, 285; 257/E21.632
See application file for complete search history.

(56) References Cited

U.S. PATENT DOCUMENTS

| 7,282,402 | B2 | 10/2007 | Sadaka et al. ................. 438/221 |
| 2008/0079086 | A1 | 4/2008 | Jung et al. ..................... 257/369 |
| 2008/0111155 | A1 | 5/2008 | Capasso et al. ................ 257/192 |
| 2009/0017602 | A1* | 1/2009 | Damlencourt et al. ....... 438/481 |

OTHER PUBLICATIONS

Translation of Official Communication from German Patent Office for German Patent Application No. 10 2009 035 418.2-33 dated Feb. 1, 2011.

* cited by examiner

*Primary Examiner* — Thanhha Pham
(74) *Attorney, Agent, or Firm* — Williams, Morgan & Amerson, P.C.

(57) ABSTRACT

A growth mask provided for the deposition of a threshold adjusting semiconductor alloy may be formed on the basis of a deposition process, thereby obtaining superior thickness uniformity. Consequently, P-channel transistors and N-channel transistors with an advanced high-k metal gate stack may be formed with superior uniformity.

22 Claims, 9 Drawing Sheets

FORMATION OF A CHANNEL SEMICONDUCTOR ALLOY BY DEPOSITING A HARD MASK FOR THE SELECTIVE EPITAXIAL GROWTH

BACKGROUND OF THE INVENTION

1. Field of the Invention

Generally, the present disclosure relates to sophisticated integrated circuits including advanced transistor elements that comprise advanced gate structures including a metal-containing electrode and a high-k gate dielectric of increased permittivity.

2. Description of the Related Art

The fabrication of advanced integrated circuits, such as CPUs, storage devices, ASICs (application specific integrated circuits) and the like, requires a large number of circuit elements to be formed on a given chip area according to a specified circuit layout, wherein field effect transistors represent one important type of circuit element that substantially determines performance of the integrated circuits. Generally, a plurality of process technologies are currently practiced, wherein, for many types of complex circuitry, including field effect transistors, MOS technology is currently one of the most promising approaches due to the superior characteristics in view of operating speed and/or power consumption and/or cost efficiency. During the fabrication of complex integrated circuits using, for instance, MOS technology, millions of transistors, e.g., N-channel transistors and/or P-channel transistors, are formed on a substrate including a crystalline semiconductor layer. A field effect transistor, irrespective of whether an N-channel transistor or a P-channel transistor is considered, typically comprises so-called PN junctions that are formed by an interface of highly doped regions, referred to as drain and source regions, with a slightly doped or non-doped region, such as a channel region, disposed adjacent to the highly doped regions. In a field effect transistor, the conductivity of the channel region, i.e., the drive current capability of the conductive channel, is controlled by a gate electrode formed adjacent to the channel region and separated therefrom by a thin insulating layer. The conductivity of the channel region, upon formation of a conductive channel due to the application of an appropriate control voltage to the gate electrode, depends on the dopant concentration, the mobility of the charge carriers and, for a given extension of the channel region in the transistor width direction, on the distance between the source and drain regions, which is also referred to as channel length. Hence, in combination with the capability of rapidly creating a conductive channel below the insulating layer upon application of the control voltage to the gate electrode, the conductivity of the channel region substantially affects the performance of MOS transistors. Thus, as the speed of creating the channel, which depends on the conductivity of the gate electrode, and the channel resistivity substantially determine the transistor characteristics, the scaling of the channel length, and associated therewith the reduction of channel resistivity and reduction of gate resistivity, is a dominant design criterion for accomplishing an increase in the operating speed of the integrated circuits.

Presently, the vast majority of integrated circuits are fabricated on the basis of silicon due to the substantially unlimited availability thereof, the well-understood characteristics of silicon and related materials and processes and the experience gathered over the last 50 years. Therefore, silicon will likely remain the material of choice in the foreseeable future for circuit generations designed for mass products. One reason for the importance of silicon in fabricating semiconductor devices has been the superior characteristics of a silicon/silicon dioxide interface that allows reliable electrical insulation of different regions from each other. The silicon/silicon dioxide interface is stable at high temperatures and, thus, allows the performance of subsequent high temperature processes, as are required, for example, for anneal cycles to activate dopants and to cure crystal damage without sacrificing the electrical characteristics of the interface.

For the reasons pointed out above, in field effect transistors, silicon dioxide is preferably used as a gate insulation layer that separates the gate electrode, frequently comprised of polysilicon or other metal-containing materials, from the silicon channel region. In steadily improving device performance of field effect transistors, the length of the channel region has been continuously decreased to improve switching speed and drive current capability. Since the transistor performance is controlled by the voltage supplied to the gate electrode to invert the surface of the channel region to a sufficiently high charge density for providing the desired drive current for a given supply voltage, a certain degree of capacitive coupling, provided by the capacitor formed by the gate electrode, the channel region and the silicon dioxide disposed therebetween, has to be maintained. It turns out that decreasing the channel length requires an increased capacitive coupling to avoid the so-called short channel behavior during transistor operation. The short channel behavior may lead to an increased leakage current and to a pronounced dependence of the threshold voltage on the channel length. Aggressively scaled transistor devices with a relatively low supply voltage and thus reduced threshold voltage may suffer from an exponential increase of the leakage current due to the required enhanced capacitive coupling of the gate electrode to the channel region that is accomplished by decreasing the thickness of the silicon dioxide layer. For example, a channel length of approximately 0.08 µm may require a gate dielectric made of silicon dioxide as thin as approximately 1.2 nm. Although, generally, usage of high speed transistor elements having an extremely short channel may be restricted to high-speed signal paths, whereas transistor elements with a longer channel may be used for less critical signal paths, the relatively high leakage current caused by direct tunneling of charge carriers through an ultra-thin silicon dioxide gate insulation layer may reach values for an oxide thickness in the range of 1-2 nm that may no longer be compatible with requirements for many types of integrated circuits.

Therefore, replacing silicon dioxide, or at least a part thereof, as the material for gate insulation layers has been considered. Possible alternative dielectrics include materials that exhibit a significantly higher permittivity so that a physically greater thickness of a correspondingly formed gate insulation layer nevertheless provides a capacitive coupling that would be obtained by an extremely thin silicon dioxide layer. It has, thus, been suggested to replace silicon dioxide with high permittivity materials, such as tantalum oxide ($Ta_2O_5$), with a k of approximately 25, strontium titanium oxide ($SrTiO_3$), having a k of approximately 150, hafnium oxide ($HfO_2$), HfSiO, zirconium oxide ($ZrO_2$) and the like.

When advancing to sophisticated gate architecture based on high-k dielectrics, additionally, transistor performance may also be increased by providing an appropriate conductive material for the gate electrode to replace the usually used polysilicon material, since polysilicon may suffer from charge carrier depletion at the vicinity of the interface to the gate dielectric, thereby reducing the effective capacitance between the channel region and the gate electrode. Thus, a gate stack has been suggested in which a high-k dielectric material provides enhanced capacitance even at a less critical thickness compared to a silicon dioxide layer, while additionally maintaining leakage currents at an acceptable level. On the other hand, metal-containing non-polysilicon material, such as titanium nitride and the like, may be formed so as to directly connect to the high-k dielectric material, thereby substantially avoiding the presence of a depletion zone. Therefore, the threshold voltage of the transistors is significantly affected by the work function of the gate material that is in contact with the gate dielectric material, and an appropriate adjustment of the effective work function with respect to the conductivity type of the transistor under consideration has to be guaranteed.

For example, appropriate metal-containing gate electrode materials, such as titanium nitride and the like, may frequently be used in combination with appropriate metal species, such as lanthanum, aluminum and the like, so as to adjust the work function to be appropriate for each type of transistor, i.e., N-channel transistors and P-channel transistors, which may require an additional band gap offset for the P-channel transistor. For this reason, it has been proposed to appropriately adjust the threshold voltage of transistor devices by providing a specifically designed semiconductor material at the interface between the high-k dielectric material and the channel region of the transistor device, in order to appropriately "adapt" the band gap of the specifically designed semiconductor material to the work function of the metal-containing gate electrode material, thereby obtaining the desired low threshold voltage of the transistor under consideration. Typically, a corresponding specifically designed semiconductor material, such as silicon/germanium and the like, may be provided by an epitaxial growth technique at an early manufacturing stage, which may also represent an additional complex process step, which, however, may avoid complex processes for adjusting the work function and thus the threshold voltages in a very advanced process stage.

It turns out, however, that the manufacturing sequence of forming the threshold adjusting semiconductor alloy may have a significant influence on transistor characteristics, as will be described in more detail with reference to FIGS. 1a-1f.

FIG. 1a schematically illustrates a cross-sectional view of a semiconductor device 100 comprising a substrate 101 above which is formed a silicon-based semiconductor material 102 having an appropriate thickness for forming therein and thereabove transistor elements. Furthermore, an isolation structure 102C is formed in the semiconductor layer 102, thereby laterally delineating and thus defining active regions 102A, 102B. In this context, an active region is to be understood as a semiconductor material in which an appropriate dopant profile is formed or is to be created in order to form PN junctions for one or more transistor elements. In the example shown in FIG. 1a, the active region 102A corresponds to a P-channel transistor while the active region 102B represents an N-channel transistor. That is, the active regions 102A, 102B comprise an appropriate basic dopant concentration in order to determine the conductivity of a P-channel transistor and an N-channel transistor, respectively. It should be appreciated that the active regions 102A, 102B may comprise or may receive other components, such as germanium, carbon and the like, in order to appropriately adjust the overall electronic characteristics. Similarly, in the active region 102A, an appropriate valence band offset is to be adjusted with respect to a sophisticated gate electrode structure still to be formed by forming an appropriate semiconductor alloy, as will be described later on.

The semiconductor device 100 as illustrated in FIG. 1a may be formed on the basis of the following conventional process strategies. First, the isolation structure 102C is formed by well-established lithography, etch, deposition, planarization and anneal techniques, in which a trench is formed in the semiconductor layer 102, which is subsequently filled with an appropriate insulating material, such as silicon dioxide and the like. It should be appreciated that the process sequence for forming the isolation structure 102C may result in a more or less pronounced stress level that may be induced in the active regions 102A, 102B, for instance by forming a dense silicon oxide material, at least partially, in the isolation trenches 102C, which may result in a stressed state of a portion of the silicon dioxide material. After removing any excess material and planarizing the surface topography, the further processing is typically continued by performing a plurality of implantation processes using an appropriate masking regime in order to introduce the required dopant species for generating the basic dopant concentration in the active regions 102A, 102B corresponding to the type of transistors to be formed therein and thereabove. After activating the dopant species and re-crystallizing implantation-induced damage, the further processing is continued by exposing the device 100 to an oxidizing ambient 110, which is typically established on the basis of elevated temperatures, for instance in the range of 700-1200° C., and supplying oxygen in order to obtain a desired oxidation rate. Consequently, during the dry oxidation process 110, a mask layer 104 may be formed in a well-controllable manner during the process 110. For instance, a maximum thickness of the mask layer 104 may be 10 nm or less.

FIG. 1b schematically illustrates the semiconductor device 100 in a further advanced manufacturing stage in which an etch mask 105, such as a resist mask, is formed above the semiconductor device 100 such that the mask material 104 on the first active region 102A is exposed, while the portion of the mask material 104 formed on the second active region 102B is protected by the mask 105. The etch mask 105 may be formed by any well-established lithography techniques. Thereafter, an etch process is applied in order to selectively remove the mask material 104 from the first semiconductor region, which is typically accomplished by using any selective etch chemistry, such as diluted hydrofluoric acid (HF), which enables a selective removal of silicon dioxide material while substantially not attacking silicon material.

FIG. 1c schematically illustrates the semiconductor device 100 in a further advanced manufacturing stage, i.e., after the selective removal of the mask material 104 and the removal of the etch mask 105 (FIG. 1b). It should be appreciated that, due to the preceding etch sequence, a certain material loss may also occur in the isolation structure 102C, i.e., in an exposed portion thereof.

FIG. 1d schematically illustrates the semiconductor device 100 when exposed to a further reactive process ambient 106, which may include a cleaning process and the like in order to prepare the device 100 for the subsequent deposition of a silicon/germanium alloy selectively on the first active region 102A. The process 106 may be established on the basis of any appropriate chemistries in order to remove contaminants and the like, which may have been created during the previous removal of the etch mask and the like. Typically, the cleaning process 106 may cause a certain degree of material erosion of the mask 104, thereby reducing a thickness thereof, as indicated by 104R, however, without intending to expose surface portions of the second active region 102B. It should be appreciated that the cleaning process 106, which may remove native oxides and the like, may be required so as to obtain appropriate surface conditions for epitaxially growing the silicon/germanium material in the subsequent process step. In order to not unduly expose the semiconductor device 100 to any other environmental conditions, such as the clean room atmosphere and the like, typically, a very restricted queue time requirement may have to be respected, i.e., a certain time interval between the cleaning process 106 and the subsequent actual deposition of the silicon/germanium alloy should not be exceeded in view of the process quality of the subsequent deposition process.

FIG. 1e schematically illustrates the semiconductor device 100 during a selective epitaxial growth process 107 in which process parameters, such as temperature, pressure, flow rates of precursor gasses and the like, are appropriately selected such that material deposition may be substantially restricted to exposed silicon surface areas while the dielectric surfaces may substantially prevent a deposition of material. Consequently, during the process 107, a silicon/germanium material 108 may be selectively formed on the active region 102A and to a certain degree on the isolation structure 102C, depending on the degree of exposure of any sidewall surfaces of the active region 102A. As previously explained, the finally obtained threshold of a transistor to be formed in and above the active region 102A may strongly depend on the characteristics of the layer 108, such as the germanium concentration and the thickness thereof, such that precisely determined process conditions have to be established during the process 107 and thus also during the cleaning process 106 and a time interval between these two process steps. It should be appreciated that a further cleaning process may typically be performed prior to actually depositing the material 108, which, however, may also strongly depend on the efficiency of the cleaning process 106. On the other hand, the mask layer 104 is to efficiently prevent material deposition on the active regions 102B in view of transistor characteristics of a corresponding N-channel transistor to be formed in and above the active region 102B.

After the deposition process 107, the mask layer 104 is removed, for instance, by using selective wet chemical etch recipes and thereafter the further processing is continued by forming the actual transistor structures.

FIG. 1f schematically illustrates the semiconductor device 100 in a further advanced manufacturing stage in which a transistor 150A is formed in and above the active region 102A, including at least a portion of the silicon/germanium alloy 108. Similarly, a transistor 150B is formed in and above the active region 102B, wherein, in the transistor 150B, the presence of a silicon/germanium alloy should be avoided. In the manufacturing stage shown, the transistors 150A, 150B, which represent a P-channel transistor and an N-channel transistor, respectively, comprise a gate electrode structure 160A and 160B, respectively. As shown, the gate electrode structure 160A is formed on the threshold adjusting silicon/germanium alloy 108 and comprises a gate dielectric material 161 comprising a high-k dielectric material, in combination with a metal-containing electrode material 162. Furthermore, a "conventional" electrode material, such as a polysilicon material 163, is typically formed above the electrode material 162. The gate electrode structure 160B has a similar configuration except for the threshold adjusting silicon/germanium alloy so that the gate dielectric material 161 is directly formed on the active region 102B. Furthermore, the transistors 150A, 150B comprise a spacer structure 151, which may have any appropriate configuration in order to obtain a desired dopant profile for drain and source regions 153 and to provide a desired mask for a silicidation process, which may still be performed in a later manufacturing stage. Additionally, a channel region 152 is laterally enclosed by the drain and source regions 153 and connects to the gate dielectric material 161. Thus, in the transistor 150A, the channel region 152 may also comprise a portion of the silicon/germanium alloy 108, thereby providing a desired work function and thus threshold of the transistor 150A.

The semiconductor device 100 as illustrated in FIG. 1f may be formed on the basis of any well-established process techniques, which include the deposition of the materials 161, 162 and 163, possibly in combination with other materials, such as dielectric cap layers, anti-reflective coating (ARC) materials, hard mask materials and the like. It should be appreciated that the materials 161 and 162 may thus be selected such that a desired high capacitive coupling is achieved in combination with a superior conductivity, while also a desired work function and thus threshold for the transistor 150B may be set without requiring any additional band gap adjustments. After the patterning of the sophisticated layer stack in order to obtain the gate electrode structures 160A, 160B, the drain and source regions 153 may be formed on the basis of well-established implantation techniques using appropriate masking regimes. It should be appreciated that additional strain-inducing mechanisms may be implemented, if required. In principle, the transistors 150A, 150B may provide superior performance and may allow the adjustment of the basic transistor characteristics in an early manufacturing stage due to the provision of the silicon/germanium alloy 108 and appropriate metal species in the layer 162, thereby avoiding sophisticated manufacturing techniques in a very advanced manufacturing stage in order to appropriately adjust the threshold voltages of field effect transistors, as may be required in so-called replacement gate approaches. However, it turns out that a certain degree of transistor variability may be observed in the transistor 150B, due to the presence of silicon/germanium residues 108R, which may be created in an early manufacturing stage when forming the silicon/germanium layer 108 (FIG. 1e). For example, the presence of the residues 108R may change the electronic characteristics of the active region 102B and may also have a negative influence during the further processing, for instance when forming metal silicide regions in the drain and source regions 153. On the other hand, a certain degree of transistor variability may also be observed for the P-channel transistor 150A, which may be correlated with the corresponding queue time dependency, as previously explained, in particular when the device 100 may be reworked, for instance subjected to an additional cleaning process due to a queue time violation prior to the deposition of the silicon/germanium layer 108.

The present disclosure is directed to various methods that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure relates to techniques for forming complex gate electrode structures on the basis of a threshold adjusting semiconductor alloy, wherein transistor variability may be reduced and flexibility in scheduling the overall process flow, in particular with respect to queue time violations between a clean process and a subsequent selective epitaxial growth process, may be enhanced. Without intending to restrict the present application to the following explanation, it is nevertheless assumed that a significant variation of layer thickness of a growth mask conventionally formed by an oxidation process may result in reduced reliability with respect to preventing material deposition on active regions of the N-channel transistors, in particular upon reworking substrates having experienced a queue time violation. The silicon oxide growth mask may have a significantly reduced thickness at the edge of the active regions compared to the center, which may significantly increase the probability of exposing certain surface areas prior to the deposition of the threshold adjusting semiconductor material. Consequently, the threshold adjusting semiconductor material may also form locally in active regions of the N-channel transistors, which may negatively influence transistor performance. According to the principles disclosed herein, overall thickness uniformity of the growth mask and thus of the entire process flow may be enhanced by providing the mask material at least partially by a deposition process, possibly in combination with additional materials and/or treatments in order to adjust the final desired characteristics of the growth mask.

One illustrative method disclosed herein comprises forming a mask layer on a first active region and a second active region of a semiconductor device by performing a deposition process. The method further comprises removing the mask layer selectively from the first active region and forming a layer of a semiconductor alloy on the first active region while using the mask layer on the second active region as a growth mask. Furthermore, the mask layer is removed from the second active region. Additionally, the method comprises forming a first gate electrode structure of a first transistor on the layer of a semiconductor alloy and forming a second gate electrode structure of a second transistor on the second active region, wherein the first and second gate electrode structures comprise a gate insulation layer including a high-k dielectric material.

A further illustrative method disclosed herein relates to forming a semiconductor device. The method comprises depositing a silicon oxide layer on a first active region and a second active region. Additionally, the silicon oxide layer is selectively removed from above the first active region. The method further comprises forming a threshold adjusting semiconductor material on the first active region and using the silicon oxide layer formed on the second active region as a deposition mask. Moreover, the silicon oxide layer is removed from above the second active region. Additionally, the method comprises forming a first gate electrode structure of a first transistor on the threshold adjusting semiconductor material and forming a second gate electrode structure of a second transistor on the second active region.

A still further illustrative method disclosed herein comprises forming a mask layer stack on a first active region and a second active region of a semiconductor device. Moreover, the mask layer stack is selectively removed from the first active region. The method additionally comprises forming a layer of a semiconductor alloy on the first active region and using the mask layer stack on the second active region as a growth mask. Furthermore, the mask layer stack is removed from the second active region. Additionally, the method comprises forming a first gate electrode structure of a first transistor on the layer of a semiconductor alloy and forming a second gate electrode structure of a second transistor on the second active region, wherein the first and second gate electrode structures comprise a metal-containing gate electrode material and a gate insulation layer including a high-k dielectric material.

BRIEF DESCRIPTION OF THE DRAWINGS

The disclosure may be understood by reference to the following description taken in conjunction with the accompanying drawings, in which like reference numerals identify like elements, and in which.

Figure 1A:
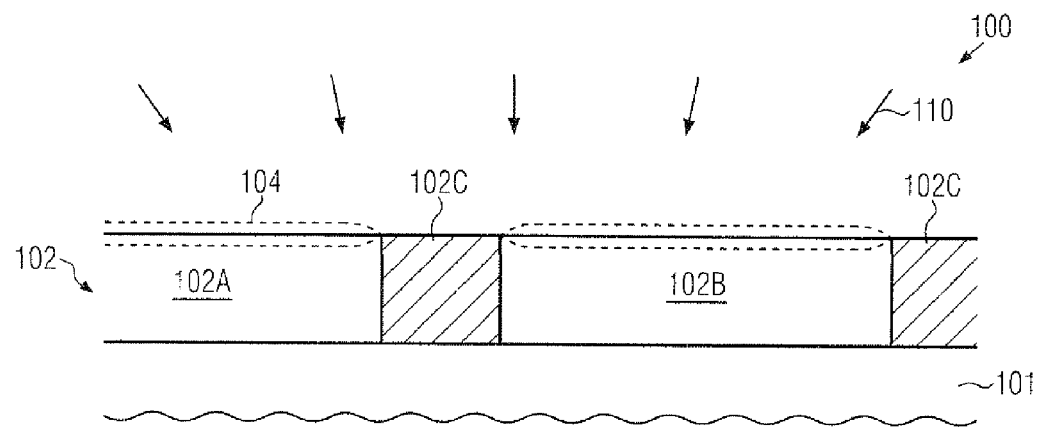
FIGS. 1a-1f schematically illustrate cross-sectional views of a conventional semiconductor device in which sophisticated gate electrode structures are formed on the basis of a threshold adjusting silicon/germanium alloy, thereby causing transistor variabilities.
Figure 1B:
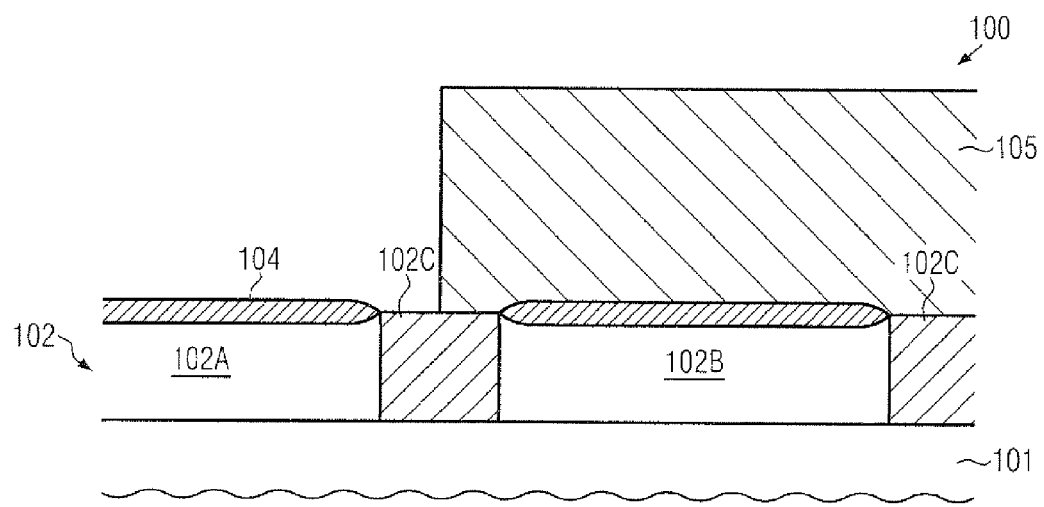
Figure 1C:
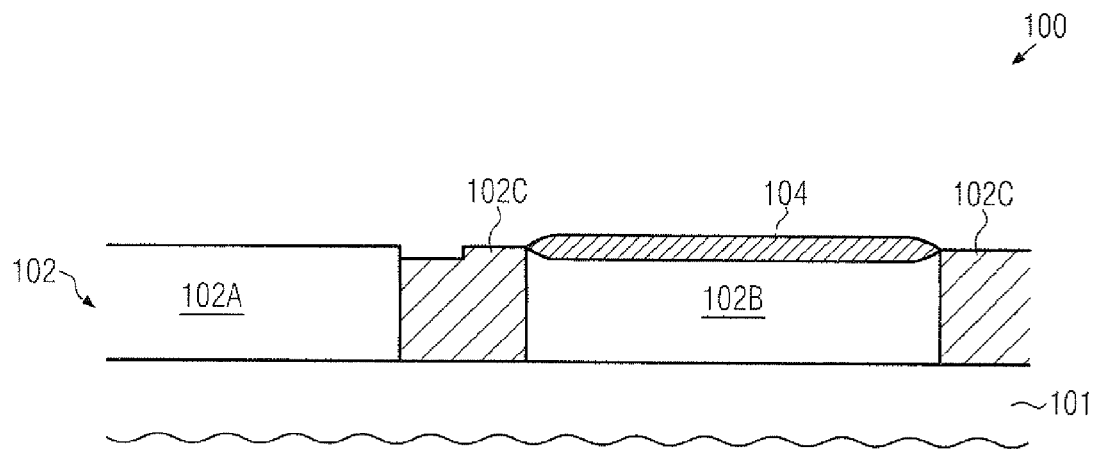
Figure 1D:
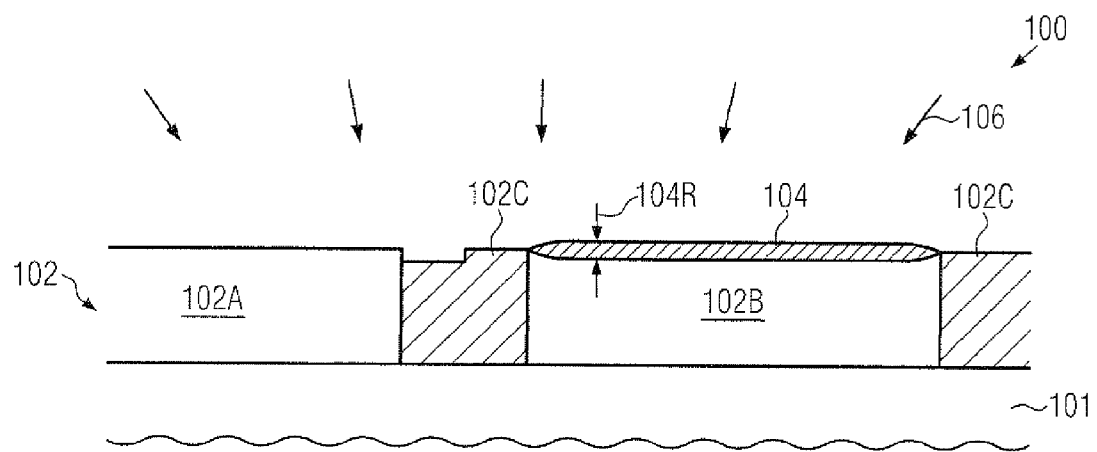
Figure 1E:
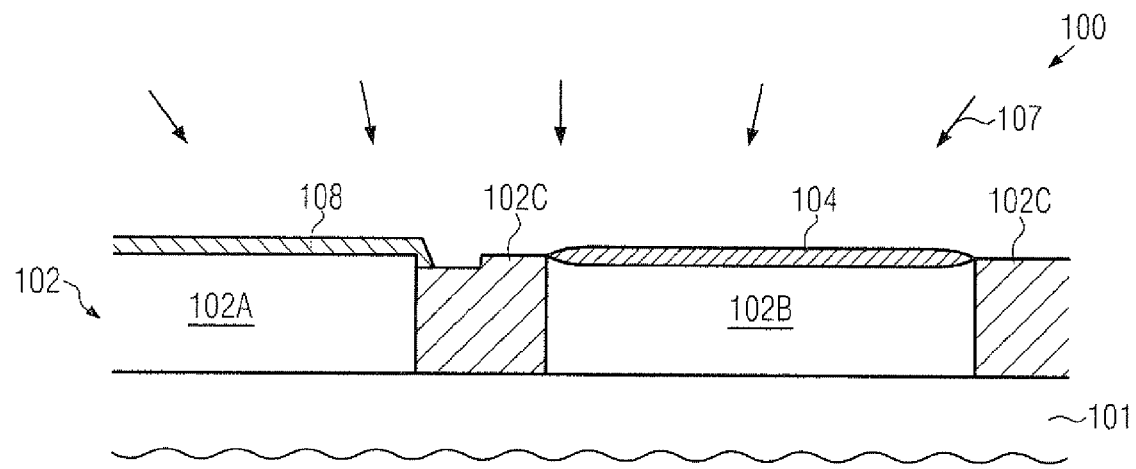
Figure 1F:
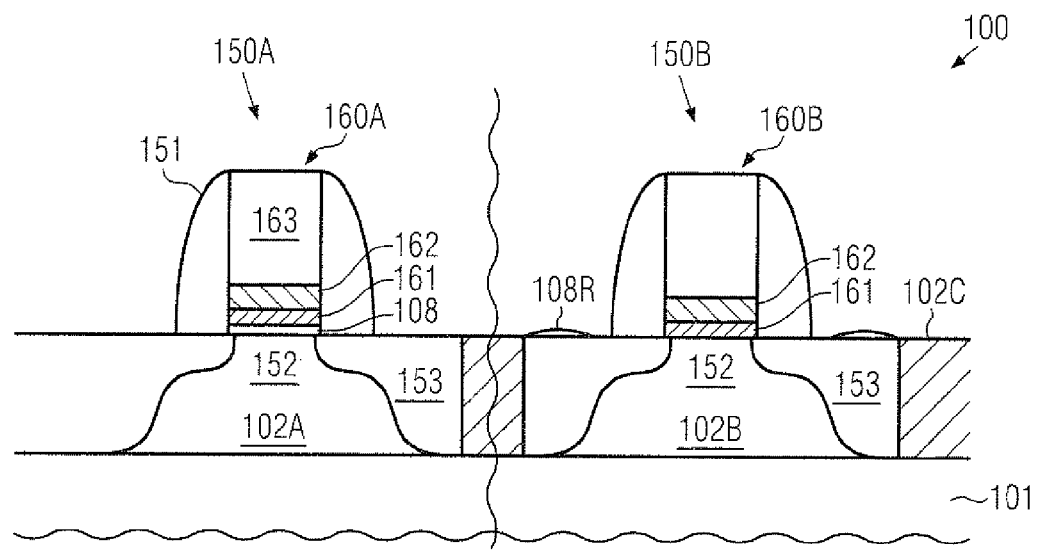

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present disclosure relates to techniques for forming a growth mask in an early manufacturing stage with superior thickness uniformity in order to suppress the probability of creating material residues on N-channel transistors. As briefly discussed above, it is assumed that the stress conditions in the active regions of sophisticated semiconductor devices may have a significant influence on the local oxidation rate during the formation of the mask layer, thereby resulting in a locally varying oxide thickness of up to 40 percent difference between the periphery of the active region and the center thereof. For this reason, the principles disclosed herein provide techniques in which at least one deposition process may be applied to provide a significant portion of a mask layer or mask layer stack. Consequently, a significantly reduced thickness variability of the mask material may be obtained, since the deposition process may be less dependent on the local stress conditions in the active regions. In some illustrative embodiments disclosed herein, the material characteristics of a deposited dielectric material may further be adjusted, for instance in view of density and thus etch resistivity, by performing a subsequent treatment, such as an anneal process, a plasma-based treatment and the like. For example, an oxide material that may be formed on the basis of a thermally activated chemical vapor deposition (CVD) process or on the basis of a plasma assisted CVD process may be "densified" by performing an anneal process, for instance on the basis of temperatures of approximately 900-1100° C. in an inert atmosphere for several seconds so as to not unduly initiate oxygen diffusion into the lower lying silicon material of the active regions, while nevertheless providing superior material density. In other cases, other appropriate dielectric materials, such as silicon nitride and the like, may be efficiently used as a base material which may be formed by using any appropriate deposition technique, while additional treatments may be performed if the material characteristics are to be further improved. In some illustrative embodiments, a silicon nitride material may be provided by deposition and may be subsequently "oxidized" in a plasma ambient, a thermal oxidation ambient and the like, thereby imparting superior etch resistivity to the resulting material without significantly introducing an oxygen species into the active regions.

In still other illustrative embodiments, the mask layer may be provided in the form of two or more individual material layers, wherein at least one of these materials may be formed by a deposition process, thereby providing the desired superior thickness uniformity.

With reference to FIGS. 2a-2l, further illustrative embodiments will now be described in more detail, wherein reference may also be made to FIGS. 1a-1f, if appropriate.

Figure 2A:
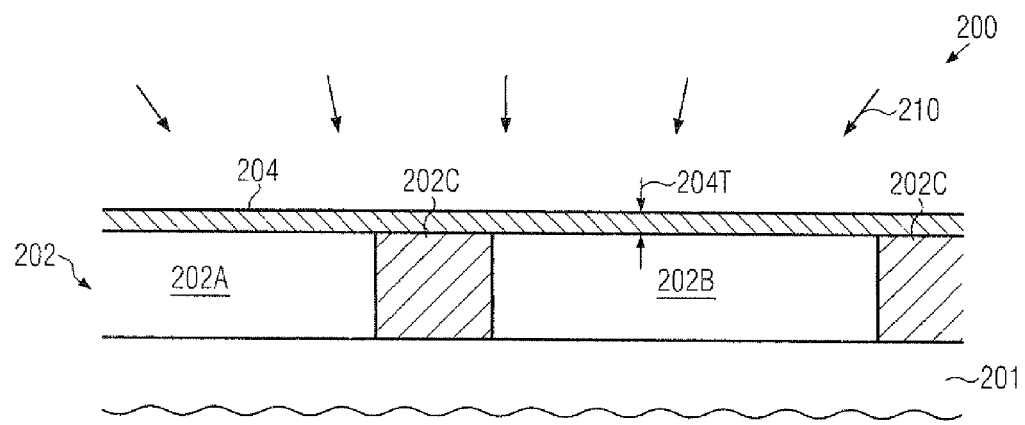
FIGS. 2a-2g schematically illustrate cross-sectional views of a semiconductor device during various manufacturing stages in forming advanced gate electrode structures on the basis of a threshold adjusting semiconductor alloy, wherein superior transistor uniformity may be obtained due to the provision of a deposition mask formed on the basis of a deposition process, according to illustrative embodiments.

FIG. 2a schematically illustrates a cross-sectional view of a semiconductor device 200 that comprises a substrate 201 and a device layer 202, which, in the manufacturing stage shown, may comprise a substantially crystalline semiconductor material in the form of a plurality of active regions 202A, 202B. Furthermore, an isolation structure 202C may be provided in the device layer 202 and may laterally delineate the active regions 202A, 202B according to the overall circuit layout of the device 200. It is to be noted that the device layer 202 may initially be provided as a continuous semiconductor layer and thus the layer 202 may also be referred to as a "semiconductor layer," irrespective of the fact that the layer 202 may be comprised of a plurality of semiconductor "islands" in the form of the active regions 202A, 202B in the manufacturing stage shown. Furthermore, in some illustrative embodiments (not shown), the semiconductor layer 202 and the substrate 201 may represent a silicon-on-insulator (SOI) configuration when a buried insulating layer (not shown) is formed between the substrate 201 and the semiconductor layer 202. In this case, the active regions 202A, 202B may be completely insulated from each other. The active regions 202A, 202B may have any appropriate size and shape in order to form one or more transistor elements in and above the active regions, wherein sophisticated gate electrode structures may have to be provided with a gate length of approximately 50 nm and less in combination with an advanced gate design by using a high-k dielectric material in combination with a metal-containing electrode material.

Furthermore, a mask layer 204 is formed on the active regions 202A, 202B and on the isolation structure 202C, wherein a thickness 204T of the layer 204 may vary within each of the active regions 202A, 202B by less than approximately 5 percent with respect to a maximum thickness. In other cases, a thickness variation within a single active region 202A, 202B may be approximately less than 1 percent relative to a maximum value of the thickness 204T. The thickness 204T may be selected in accordance with the material characteristics of the layer 204 and in view of the further processing so as to provide sufficient etch resistivity in order to maintain a desired material thickness upon depositing a threshold adjusting semiconductor alloy in a selective epitaxial growth process in a further advanced manufacturing stage. As previously explained, cleaning processes, mask removal processes and the like may have to be performed during the further processing and may result in a certain degree of material erosion of the layer 204, which may be taken into account by providing an appropriate initial thickness. For instance, a thickness of approximately 10-50 nm may be used, depending on the material characteristics of the layer 204. In one illustrative embodiment, the layer 204 may be provided in the form of a silicon oxide material, such as a silicon dioxide material and the like. In other cases, other appropriate material compositions, such as silicon nitride, silicon carbide, nitrogen-containing silicon carbide, silicon oxynitride and the like, may be used. It should be appreciated that in some cases the layer 204 may represent a base material, the characteristics of which may be adjusted during subsequent processes, as will also be described later on.

It should further be appreciated that the initial thickness 204T may be selected such that a reworking of the device 200 may be possible prior to performing the selective epitaxial growth process, as will be described later on in more detail.

With respect to any process strategies for forming the semiconductor device 200, the same criteria may apply as previously explained with reference to the semiconductor device 100, except for providing the mask layer 204 with enhanced uniformity in view of layer thickness. After forming the isolation structure 202C and establishing a desired basic doping of the active regions 202A, 202B, the device 200 may be exposed to the process ambient of a deposition process 210 in order to form the layer 204 with the desired thickness 204T. For example, a plurality of plasma-based CVD recipes are available for depositing materials, such as silicon dioxide, silicon nitride, silicon oxynitride, silicon carbide and the like. In other cases, a thermally activated CVD process may be applied, which may result in superior material density, for instance for forming a silicon nitride material and the like. Consequently, well-established processes, precursor materials and process tools may be used during the process 210.

Figure 2B:
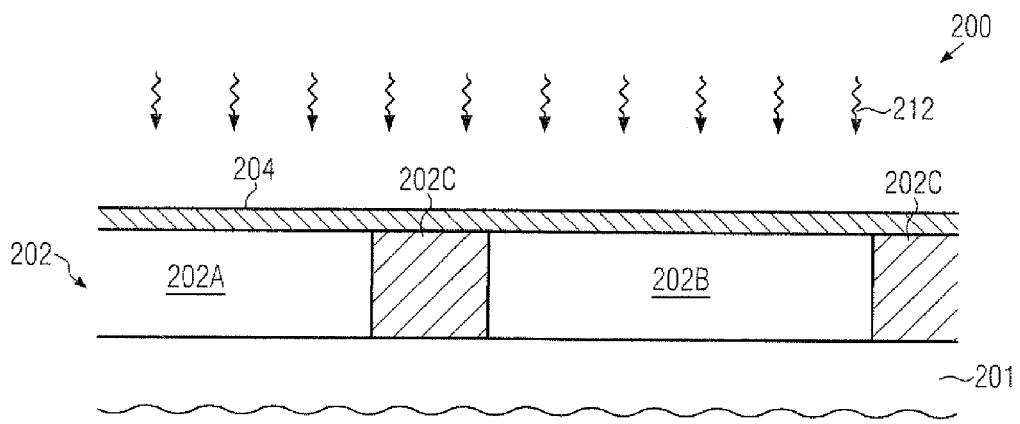

FIG. 2b schematically illustrates the semiconductor device 200 according to illustrative embodiments in which the characteristics of the mask layer 204 may be modified, for instance on the basis of a treatment 212, which may be performed as an anneal process, a plasma treatment and the like. In one embodiment, the process 212 may represent a heat treatment performed on the basis of temperatures of approximately 900-1100° C., for instance at approximately 1000° C., when the layer 204 is substantially comprised of a silicon oxide material. During such a heat treatment, the material of the layer 204 may be "densified," thereby imparting an increased etch resistivity to the layer 204, which may thus result in similar material characteristics of the layer 204 compared to the characteristics of a silicon oxide material obtained on the basis of a thermal oxidation process. Consequently, the layer 204 may exhibit a similar etch resistivity with respect to, for instance, diluted hydrofluoric acid (HF), wherein any difference in etch rate compared to a thermal oxide may be taken into consideration by appropriately selecting the initial thickness of the layer 204. That is, a somewhat higher etch rate of the layer 204 may be compensated for by selecting a greater initial thickness compared to a conventional strategy. It should be appreciated that appropriate material characteristics of the mask layer 204 may be readily determined on the basis of experiments and the like. Similarly, appropriate process parameters for the treatment 212 may be determined if a corresponding modification of the layer 204 is considered appropriate by experiments and the like. For example, an oxidation process with the above-specified temperatures for a time period of 1-10 seconds may result in a significant increase of the etch resistivity of the material 204, without unduly diffusing oxygen into the active regions 202A, 202B.

Figure 2C:
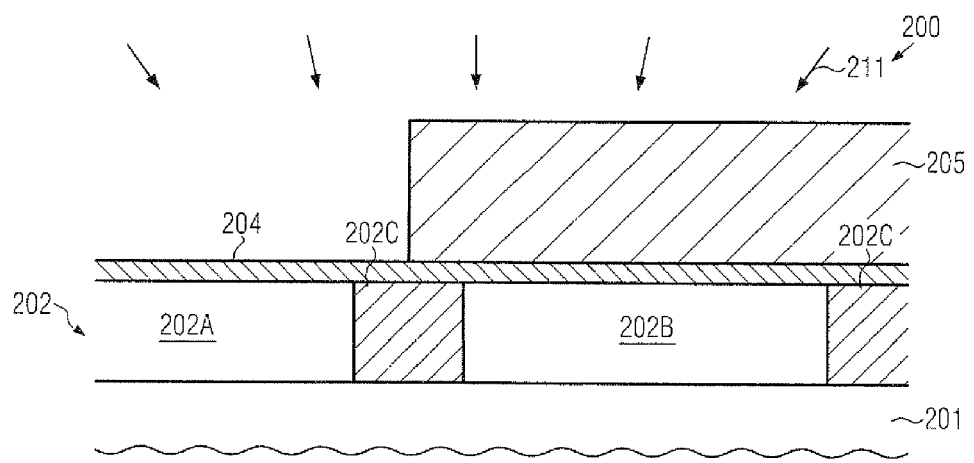

FIG. 2c schematically illustrates the semiconductor device 200 with an etch mask 205 that exposes the mask layer 204 above the active region 202A and covers the portion of the mask layer 204 formed on the active region 202B. With respect to providing the etch mask 205, for instance in the form of a resist mask or any other appropriate mask material, it is referred to the semiconductor device 100. Moreover, the device 200 may be exposed to an etch ambient 211 in order to remove the exposed portion of the mask layer 204, for instance on the basis of any appropriate etch chemistry, such as diluted HF and the like. Due to the superior uniformity of the mask layer 204, the etch process 211 may be performed on the basis of superior process conditions, for instance requiring a reduced over etch time. After the etch process 211, the etch mask 205 may be removed by using any appropriate etch strategy, such as plasma-based removal processes, wet chemical processes and the like.

Figure 2D:
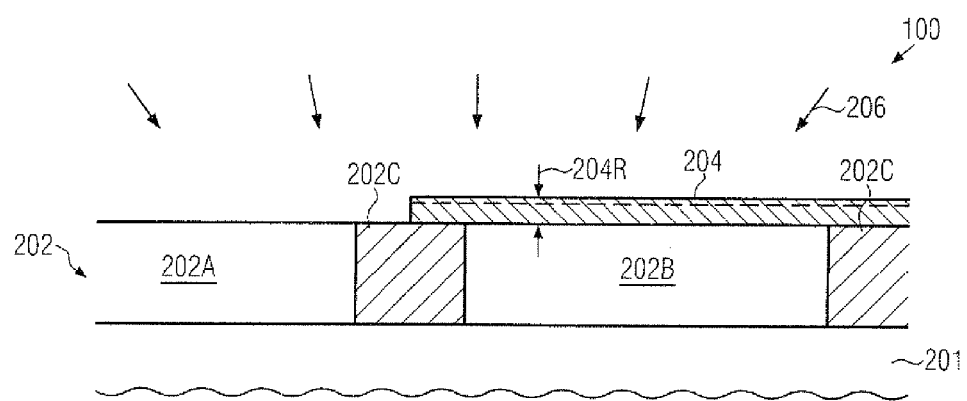

FIG. 2d schematically illustrates the semiconductor device 200 in a further advanced manufacturing stage. As illustrated, the device 200 may be exposed to a reactive process ambient 206, which may represent a cleaning process in order to prepare the active region 202A for a subsequent selective epitaxial growth process, as is also explained above. On the other hand, a remaining portion of the mask layer 204 may reliably cover the active region 202B. As described with reference to the device 100, the process 206 may remove oxide materials, contaminants and other components, thereby also causing a certain degree of material erosion of the mask layer 204, thereby resulting in a reduced thickness 204R. Contrary to conventional strategies, however, the reduced thickness 204R may still reliably cover the active region 202B due to the superior uniformity of the initial layer thickness. Consequently, the thickness 204R may also vary by less than approximately 5 percent compared to a maximum thickness of the layer 204 above the active region 202B.

As discussed above, the scheduling regime in a complex manufacturing facility may result in certain waiting times between subsequent manufacturing processes due to a non-availability of process tools, which may be caused by predictable or non-predictable maintenance events and the like. Due to the high degree of complexity, however, queue time "violations" may frequently occur, in particular if only very restricted time intervals are considered allowable between critical process steps. For instance, the cleaning process 206 and the subsequent selective epitaxial growth process may represent a critical process sequence in the sense that an undue waiting time between these two process steps may result in deteriorated surface conditions, which in turn may contribute to process variations during the selective epitaxial deposition of the threshold adjusting semiconductor material. These process variations in turn may result in varying transistor characteristics, as is discussed above. Consequently, in some illustrative embodiments, the initial thickness of the layer 204 and thus the reduced thickness 204R may be selected such that a further cleaning process may be performed while still ensuring integrity of the active region 202B. That is, a reworking of the device 200 may be possible when a queue time violation may occur with respect to the subsequent selective epitaxial growth process.

Figure 2E:
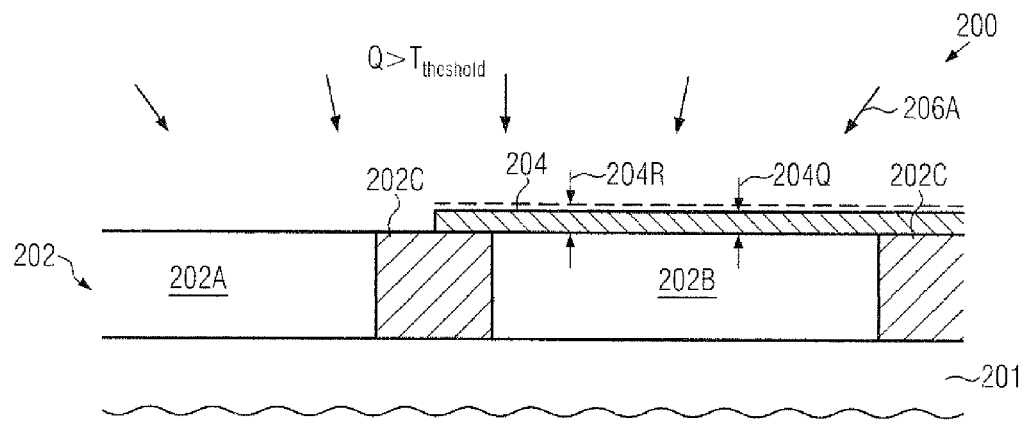

FIG. 2e schematically illustrates the semiconductor device 200 in a case in which the device 200 has experienced a queue time violation, that is, a time interval between the cleaning process 206 of FIG. 2d and the beginning of a subsequent selective growth process is greater than considered acceptable by process flow specifications. Hence, in this case, the queue time Q of the device 200 is greater than a predefined threshold T, thereby requiring a further cleaning process 206A. On the other hand, for any semiconductor devices 200 that may respect the allowable queue time T, the further processing may be continued by a selective epitaxial growth process, as is described in FIG. 2f.

During the cleaning process 206A, which may be performed on the basis of similar process parameters as the process 206 of FIG. 2d, the active region 202A may be "reworked," while also a certain material erosion may take place in the mask layer 204, thereby creating a further reduced thickness 204Q which, however, may nevertheless provide reliable coverage of the active region 202B due to the superior uniformity of the incoming layer having the thickness 204R. Consequently, the superior uniformity of the mask layer 204 may provide enhanced flexibility in scheduling the manufacturing flow since any queue time violations may not result in a loss of the associated substrates.

Figure 2F:
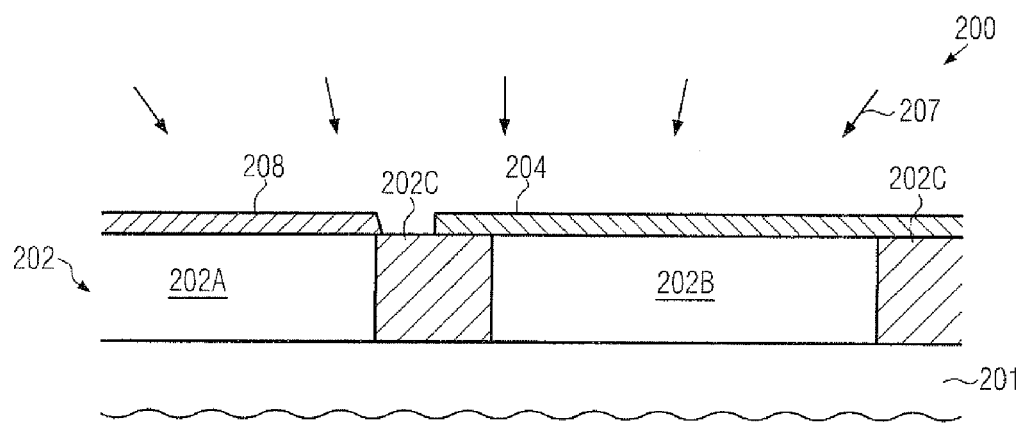

FIG. 2f schematically illustrates the semiconductor device 200, which may represent the device of FIG. 2a or 2b if no queue time violation has occurred, or which may represent the device of FIG. 2e when a queue time violation has resulted in a reworking of the device 200. During a selective epitaxial growth process 207 a threshold adjusting semiconductor material 208 may be selectively formed on the active region 202A with an appropriate thickness and material composition in order to obtain a desired threshold in combination with a gate electrode structure still to be formed. In one illustrative embodiment, the semiconductor material 208 may represent a silicon/germanium alloy having a germanium concentration of approximately 15 atomic percent germanium and higher in order to obtain an appropriate valence band offset for a P-channel transistor. On the other hand, the active region 202B may represent a P-doped region of an N-channel transistor. Due to the reliable coverage of the active region 202B, any deposition of the material 208 on the active region 202B may be substantially suppressed. After the selective epitaxial growth process 207, the mask layer 204 may be removed, as discussed above with reference to the device 100, and the further processing may be continued by forming transistor structures.

Figure 2G:
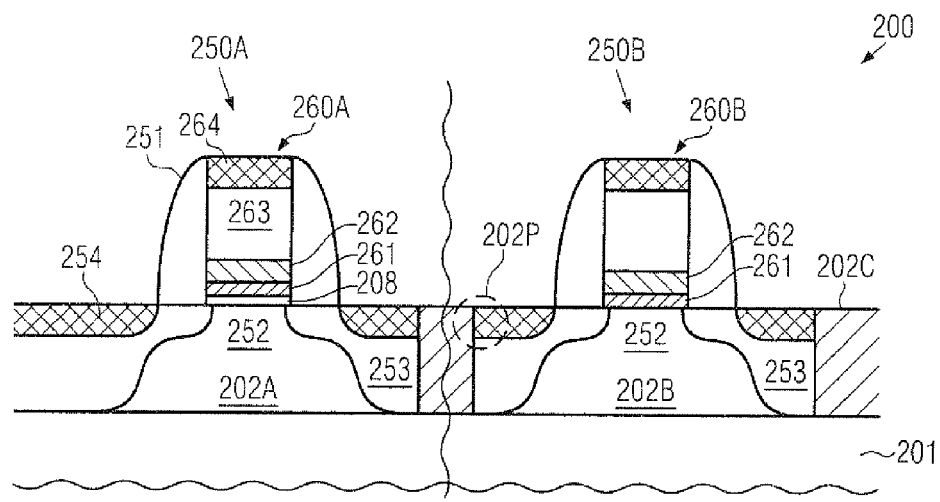

FIG. 2g schematically illustrates the semiconductor device 200 in an advanced manufacturing stage. As illustrated, a transistor 250A, such as a P-channel transistor, may be formed in and above the active region 202A. The transistor 250A may comprise a channel region 252 and drain and source regions 253, possibly in combination with metal silicide regions 254. It should be appreciated that at least the channel region 252 in the above region 202A may comprise the threshold adjusting semiconductor alloy 208 having an appropriate material composition and thickness, as specified above, thereby adjusting a threshold of the transistor 250A in combination with a gate dielectric material 261 and a metal-containing electrode material 262 of a gate electrode structure 260A. Moreover, the electrode structure 260A may comprise an additional electrode material 263, such as a polysilicon material, a silicon/germanium material and the like, possibly in combination with a metal silicide material 264. Similarly, a gate electrode structure 260B of a transistor 250B formed in and above the active region 202B, may comprise gate dielectric material 261 formed on the active region 202B. The further configuration of the gate electrode structure 260B may be substantially the same as in the gate electrode structure 260A. As also previously discussed, typically, the gate dielectric material 261 may comprise a high-k dielectric material, possibly in combination with a conventional dielectric material. It should be appreciated that, if required, the material 262 in the gate electrode structures 260A, 260B may differ in at least one metal species, while in other cases any appropriate species may be incorporated into the dielectric gate materials in order to obtain the desired threshold voltage. Furthermore, a sidewall spacer structure 251 may be formed on sidewalls of the gate electrode structures 260A, 260B.

The semiconductor device 200 as illustrated in FIG. 2g may be manufactured on the basis of any appropriate process strategy for patterning the sophisticated gate electrode structures 260A, 260B and for forming the drain and source regions 253 in combination with the metal silicide regions 254. If desired, any additional strain-inducing mechanisms may be implemented, for instance by incorporating a strain-inducing semiconductor alloy into a portion of the drain and source regions 253, for instance by using a silicon/germanium alloy and the like if a compressive strain component is considered appropriate, while a silicon/carbon alloy may be provided when a tensile strain component may be required for enhancing transistor performance. During the entire process sequence, superior process uniformity may be achieved, in particular at a peripheral region 202P of the active region 202B due to the absence of any threshold adjusting semiconductor alloy 208, as explained above. For example, in particular, enhanced uniformity during the formation of the metal silicide regions 254 may be achieved in the active region 202B due to the exclusion of the material 208. Similarly, in the transistor 250A, a superior uniformity of the entire thickness of the active region 202A, for instance in the transistor width direction, i.e., in a direction perpendicular to the drawing plane of FIG. 2g, may be achieved since the removal of the mask material 204 (FIG. 2b) may result in a more uniform overall thickness of the active region 202A. Since the threshold adjusting semiconductor material 208 may extend to the isolation structure 202C along the width direction, superior uniformity of transistor characteristics may also be achieved for the transistor 250A.

Figure 2H:
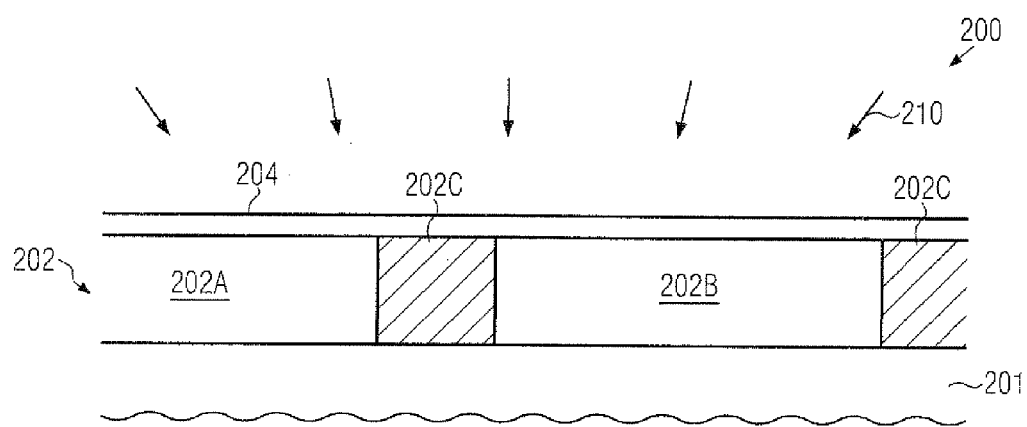
FIGS. 2h-2l schematically illustrate cross-sectional views of the semiconductor device according to still further illustrative embodiments in which additional material components or layers may be provided to enhance overall process uniformity during the growth of a threshold adjusting semiconductor alloy.

FIG. 2h schematically illustrates the semiconductor device 200 according to further illustrative embodiments in which the mask layer 204 may be deposited during the process 210 so as to provide a convenient base material, which may be subsequently modified by incorporating a further species. For example, the layer 204 may be provided as a silicon nitride material or a silicon oxide material. With respect to an initial layer thickness and with respect to any deposition techniques, it may be referred to the embodiments previously described.

Figure 2I:
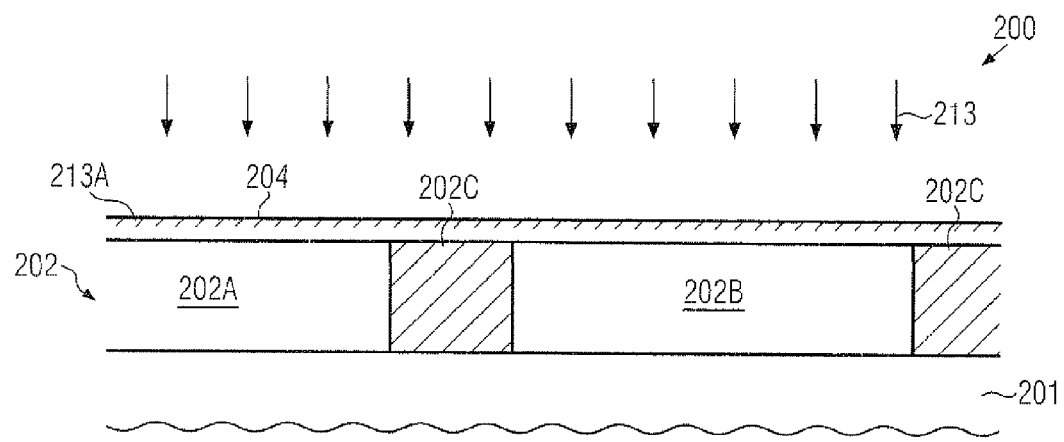

FIG. 2i schematically illustrates the device 200 when exposed to a process ambient 213, during which a further species 213A may be incorporated into the layer 204 in order to modify the characteristics thereof, such as the etch resistivity and the like. The process 213 may represent, in one embodiment, a plasma-based process, for instance for incorporating an oxygen species into a silicon nitride material. In this case, the layer 204 may be "oxidized," thereby significantly enhancing the etch resistivity of the layer 204 with respect to a plurality of etch chemistries. In other cases, oxidation of a silicon nitride-based material may be accomplished on the basis of an oxidizing ambient established at elevated temperatures in the range of 800° C. and higher. In still other illustrative embodiments, the process 213 may represent a plasma process for incorporating a nitrogen species into a silicon oxide-based material, thereby also significantly modifying the etch characteristics thereof. After the process 213, the further processing may be continued as described above.

Figure 2J:
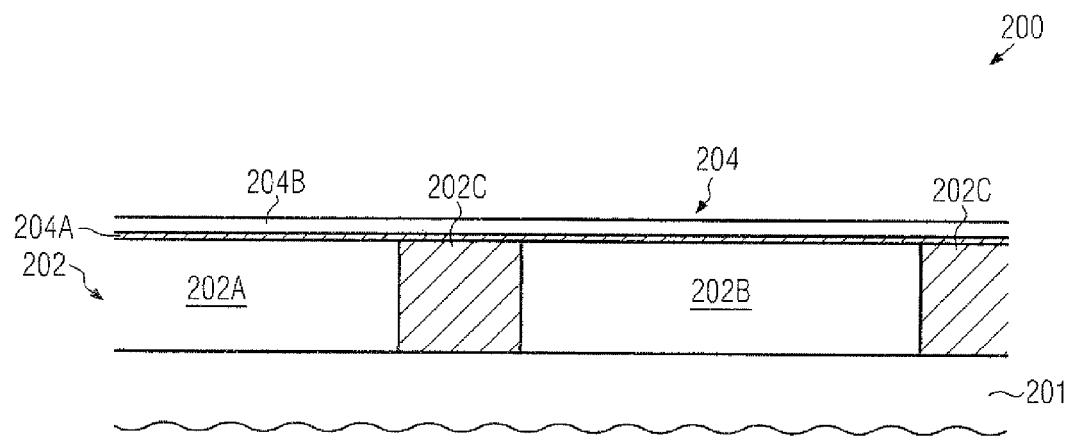

FIG. 2j schematically illustrates the semiconductor device 200 according to still further illustrative embodiments. As shown, the mask layer 204 may represent a layer stack including two or more layers 204A, 204B. The layers 204A, 204B may be provided by using at least one deposition process, for instance for forming the layer 204B with superior thickness uniformity. The layer 204A may be provided as an oxide layer, however, with a significantly reduced thickness compared to a conventional oxide mask which, in some embodiments, may be provided on the basis of a wet oxidation process, i.e., on the basis of a process ambient established by oxygen and hydrogen, thereby reducing the sensitivity of the oxidation rate with respect to a stress condition in the active regions 202A, 202B. In still other illustrative embodiments, the layer 204A may be formed on the basis of a deposition process. In one illustrative embodiment, the layer 204A may be provided as a silicon dioxide layer, while the layer 204B may be provided as a silicon nitride material. In other cases, the layer 204A may represent a silicon nitride material, a silicon carbide material and the like, while the layer 204B may represent a silicon oxide-based material. It should be appreciated that a plurality of well-established process techniques are available for depositing the layer stack 204. For example, the layer 204A may be formed as a silicon oxide material on the basis of thermally activated CVD, plasma assisted CVD and the like. Similarly, the layer 204B may be formed on the basis of thermally activated CVD techniques, thereby providing a high density silicon nitride material, while also plasma assisted deposition recipes may be applied.

Figure 2K:
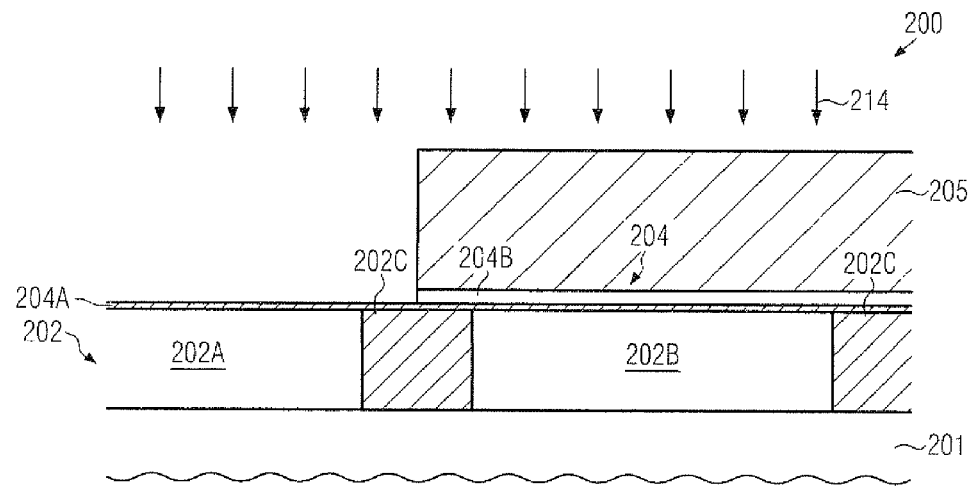

FIG. 2k schematically illustrates the semiconductor device 200 with the etch mask 205 formed above the active region 202B. Moreover, the device 200 may be exposed to a reactive etch ambient 214 that may be configured to remove the exposed portion of the layer 204B selectively to the layer 204A, which may thus act as an etch stop material. For example, a plurality of plasma assisted etch recipes are available for removing silicon nitride material selectively to silicon oxide material, or for removing silicon oxide material selectively to silicon nitride material. Consequently, the exposed portion of the layer 204B and thus the major portion of the layer stack 204 above the active region 202A may be removed without negatively affecting the material of the active region 202A. Thereafter, the etch mask 205 may be removed and the further processing may be continued by removing the exposed portion of the layer 204A, which in some illustrative embodiments may be accomplished during a cleaning process, such as the process 206 as previously described with reference to FIG. 2d. In other cases, a separate removal process may be applied. It should be appreciated that the layer 204B may have a superior resistivity with respect to the corresponding cleaning processes, thereby providing superior integrity of the active region 202B.

Figure 2L:
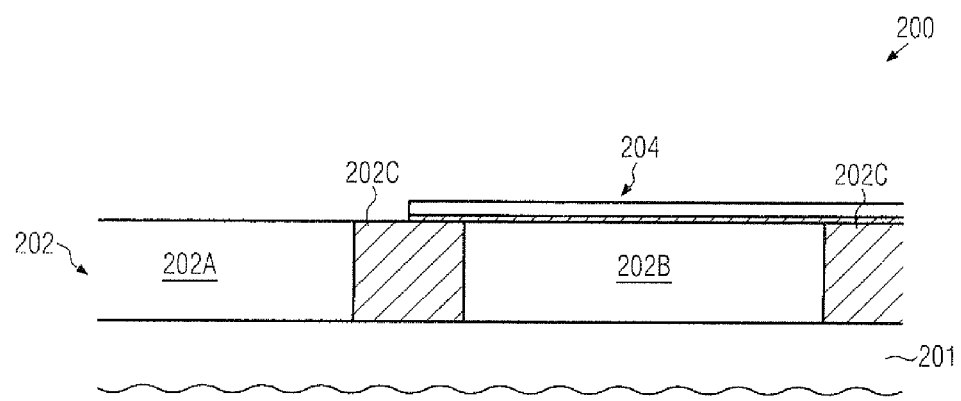

FIG. 2l schematically illustrates the device 200 prior to the selective epitaxial growth process, wherein the layer stack 204 may cover the active region 202B, while the active region 202A may be prepared for receiving the threshold adjusting semiconductor alloy. It should be appreciated that, upon occurrence of any queue time violation, the device 200 may be efficiently reworked due to the superior uniformity and resistivity of the layer stack 204. After the deposition of the threshold adjusting semiconductor alloy, the further processing may be continued by removing the layer stack 204 on the basis of any appropriate etch sequence.

As a result, the present disclosure provides manufacturing techniques in which transistors may have gate electrode structures based on high-k dielectric materials and metal-containing electrode materials wherein an appropriate threshold voltage for P-channel transistors and N-channel transistors may be adjusted in an early manufacturing stage on the basis of a threshold adjusting semiconductor alloy. Superior process uniformity and conditions with respect to reworkability of substrates prior to the epitaxial growth process may be accomplished by enhancing uniformity of a mask layer, which may be accomplished by applying at least one deposition process.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   forming a mask layer on a first active region and a second active region of a semiconductor device by performing a deposition process;
   performing a treatment on said mask layer so as to adjust at least one material characteristic of said mask layer, wherein said treatment comprises incorporating a species into said mask layer on the basis of a plasma ambient;
   removing said mask layer selectively from said first active region;
   forming a layer of a semiconductor alloy on said first active region and using said mask layer on said second active region as a growth mask;
   removing said mask layer from said second active region; and
   forming a first gate electrode structure of a first transistor on said layer of a semiconductor alloy and a second gate electrode structure of a second transistor on said second active region, said first and second gate electrode structures comprising a metal-containing gate electrode material and a gate insulation layer comprising a high-k dielectric material.

2. The method of claim 1, wherein performing said deposition process comprises forming a silicon and oxygen-containing layer.

3. The method of claim 1, wherein performing said treatment comprises oxidizing at least a surface layer of said mask layer.

4. The method of claim 1, wherein performing said deposition process comprises depositing a silicon and nitrogen-containing material.

5. The method of claim 4, wherein performing said deposition process further comprises depositing a first sub-layer and depositing a second sub-layer on said first sub-layer, and wherein removing said mask layer from said first active region comprises removing said second sub-layer using said first sub-layer as an etch stop material and removing said first sub-layer so as to expose said first active region.

6. The method of claim 5, wherein said first sub-layer is a silicon dioxide layer and said second sub-layer is a silicon nitride layer.

7. The method of claim 1, further comprising performing a cleaning process prior to forming said semiconductor alloy on said first active region, wherein said mask layer formed on said second active region acts as an etch mask.

8. The method of claim 7, further comprising performing a second cleaning process when a queue time between said first cleaning process and a process for forming said semiconductor alloy exceeds a predefined threshold.

9. The method of claim 1, wherein forming said layer of semiconductor alloy comprises performing a selective epitaxial growth process so as to suppress material deposition on said mask layer.

10. The method of claim 1, wherein said layer of semiconductor alloy is formed as a silicon/germanium alloy.

11. The method of claim 10, further comprising forming P-doped drain and source regions in said first active region and forming N-doped drain and source regions in said second active region.

12. A method, comprising:
    forming a mask layer on a first active region and a second active region of a semiconductor device by performing a deposition process, wherein performing said deposition process comprises forming a silicon and oxygen-containing layer;
    annealing said mask layer at a temperature of approximately 900-1100° C.;
    removing said mask layer selectively from said first active region;
    forming a layer of a semiconductor alloy on said first active region and using said mask layer on said second active region as a growth mask;
    removing said mask layer from said second active region; and
    forming a first gate electrode structure of a first transistor on said layer of a semicon-ductor alloy and a second gate electrode structure of a second transistor on said second active region, said first and second gate electrode structures comprising a metal-containing gate electrode material and a gate insulation layer comprising a high-k dielectric material.

13. A method of forming a semiconductor device, the method comprising:
    depositing a silicon oxide layer on a first active region and a second active region;

annealing said silicon oxide layer by performing a heat treatment at a temperature of approximately 900-1100° C.;

removing said silicon oxide layer selectively from above said first active region;

forming a threshold adjusting semiconductor material in said first active region and using said silicon oxide layer formed on said second active region as a deposition mask;

removing said silicon oxide layer from above said second active region; and forming a first gate electrode structure of a first transistor on said threshold adjusting semiconductor material and a second gate electrode structure of a second transistor on said second active region.

14. The method of claim 13, wherein forming said first and second gate electrode structures comprises forming a high-k dielectric material above said threshold adjusting semiconductor material and said second active region and forming a metal-containing electrode material above said high-k dielectric material.

15. The method of claim 13, further comprising performing a cleaning process prior to forming said threshold adjusting semiconductor material and after selectively removing said silicon oxide layer from said second active region, wherein said cleaning process reduces a thickness of said silicon oxide layer.

16. The method of claim 13, wherein said threshold adjusting semiconductor material comprises a silicon/germanium alloy.

17. A method, comprising:

forming a mask layer stack on a first active region and a second active region of a semiconductor device;

performing a treatment on said mask layer stack so as to adjust at least one material characteristic of said mask layer stack, wherein said treatment comprises at least one of incorporating a species into said mask layer stack on the basis of a plasma ambient, or annealing said mask layer stack by performing a heat treatment at a temperature of approximately 900-1100° C.;

removing said mask layer stack selectively from said first active region;

forming a layer of a semiconductor alloy on said first active region and using said mask layer stack on said second active region as a growth mask;

removing said mask layer stack from said second active region; and forming a first gate electrode structure of a first transistor on said layer of a semiconductor alloy and a second gate electrode structure of a second transistor on said second active region, said first and second gate electrode structures comprising a metal-containing gate electrode material and a gate insulation layer comprising a high-k dielectric material.

18. The method of claim 17, wherein forming said mask layer stack comprises forming an etch stop layer on said first and second active regions and depositing a dielectric material on said etch stop layer.

19. The method of claim 18, wherein removing said mask layer stack selectively from said first active region comprises forming an etch mask, removing said dielectric material by using said etch stop layer and said etch mask and removing said etch stop layer.

20. The method of claim 19, wherein said dielectric material is removed by performing a plasma assisted etch process.

21. The method of claim 20, wherein said etch stop layer is removed by performing a wet chemical etch process.

22. The method of claim 17, wherein a first layer of said mask layer stack is comprised of silicon oxide and a second layer is comprised of silicon nitride.

* * * * *